United States Patent
Cheng et al.

(10) Patent No.: US 9,224,732 B2
(45) Date of Patent: Dec. 29, 2015

(54) METHOD OF FORMING HIGH VOLTAGE DEVICE

(71) Applicant: TAIWAN SEMICONDUCTOR MANUFACTURING COMPANY, LTD., Hsinchu (TW)

(72) Inventors: Chih-Chang Cheng, Hsinchu (TW); Ruey-Hsin Liu, Hsin-Chu (TW); Chih-Wen Yao, Hsinchu (TW); Chia-Chin Shen, Hsinchu (TW); Eric Huang, Jhubei (TW); Fu Chin Yang, Fengshan (TW); Chun Lin Tsai, Hsin-Chu (TW); Hsiao-Chin Tuan, Judong County (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 6 days.

(21) Appl. No.: 14/212,081

(22) Filed: Mar. 14, 2014

(65) Prior Publication Data

US 2014/0197488 A1  Jul. 17, 2014

Related U.S. Application Data

(62) Division of application No. 12/652,294, filed on Jan. 5, 2010, now Pat. No. 8,704,312.

(51) Int. Cl.
*H01L 21/336* (2006.01)
*H01L 27/088* (2006.01)
*H01L 29/78* (2006.01)
*H01L 23/00* (2006.01)
(Continued)

(52) U.S. Cl.
CPC .......... *H01L 27/088* (2013.01); *H01L 29/7816* (2013.01); *H01L 24/16* (2013.01); *H01L 24/48* (2013.01); *H01L 29/063* (2013.01); *H01L 29/0878* (2013.01); *H01L 29/1095* (2013.01); *H01L 29/402* (2013.01); *H01L 29/42368* (2013.01); *H01L 29/456* (2013.01); *H01L 29/495* (2013.01); *H01L 29/4966* (2013.01); *H01L 29/513* (2013.01); *H01L 29/517* (2013.01); *H01L 29/518* (2013.01); *H01L 2224/16225* (2013.01); *H01L 2224/16227* (2013.01); *H01L 2224/451* (2013.01); *H01L 2224/48227* (2013.01); *H01L 2924/00014* (2013.01); *H01L 2924/01019* (2013.01); *H01L 2924/01068* (2013.01); *H01L 2924/13091* (2013.01)

(58) Field of Classification Search
CPC .......................... H01L 29/7816; H01L 27/088
USPC .......................................................... 257/337
See application file for complete search history.

(56) References Cited

U.S. PATENT DOCUMENTS 5,089,871 A  2/1992  Fujihara
6,207,994 B1  3/2001  Rumennik et al.
(Continued)

*Primary Examiner* — Laura Menz
*Assistant Examiner* — Candice Y Chan
(74) *Attorney, Agent, or Firm* — Hauptman Ham, LLP

(57) ABSTRACT

A method of forming a device includes forming a buried well region of a first dopant type in a substrate. A well region of the first dopant type is formed over the buried well region. A first well region of a second dopant type is formed between the well region of the first dopant type and the buried well region of the first dopant type. A second well region of the second dopant type is formed in the well region of the first dopant type. An isolation structure is formed at least partially in the well region of the first dopant type. A first gate electrode is formed over the isolation structure and the second well region of the second dopant type.

20 Claims, 7 Drawing Sheets

(51) Int. Cl.
  *H01L 29/06* (2006.01)
  *H01L 29/08* (2006.01)
  *H01L 29/10* (2006.01)
  *H01L 29/40* (2006.01)
  *H01L 29/423* (2006.01)
  *H01L 29/45* (2006.01)
  *H01L 29/49* (2006.01)
  *H01L 29/51* (2006.01)

(56) References Cited

U.S. PATENT DOCUMENTS

| | | |
|---|---|---|
| 6,288,424 B1 | 9/2001 | Ludikhuize |
| 6,815,794 B2 | 11/2004 | Shin et al. |
| 7,109,562 B2 | 9/2006 | Lee |
| 8,004,040 B2 | 8/2011 | Ichijo et al. |
| 2009/0261446 A1* | 10/2009 | Gogoi .................. 257/500 |

* cited by examiner

METHOD OF FORMING HIGH VOLTAGE DEVICE

PRIORITY CLAIM

The present application is a divisional of U.S. application Ser. No. 12/652,294, filed Jan. 5, 2010, which is incorporated by reference herein in its entirety.

FIELD OF THE DISCLOSURE

The present application relates generally to the field of semiconductor circuits, and more particularly, to high voltage devices and methods of forming the high voltage devices.

BACKGROUND

The demand for evermore compact, portable, and low cost consumer electronic devices has driven electronics manufacturers to develop and manufacture integrated circuits (IC) that operate with low power supply voltages resulting in low power consumption. There may be components of the devices that require higher voltages than the low power supply voltage. For example, liquid crystal display (LCD) drivers may use high voltage (HV) MOS transistors for driving LCD pixels.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
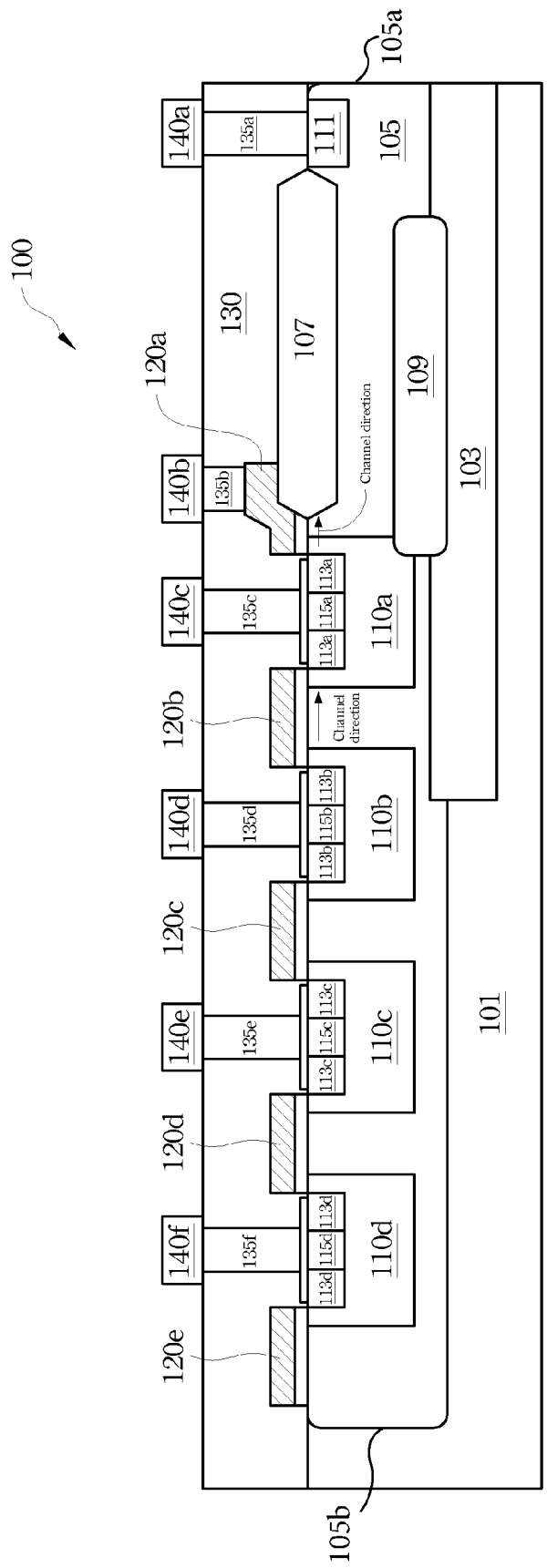
FIG. 1 is a schematic cross-sectional view of a first exemplary embodiment of a high voltage (HV) device.

A first conventional HV MOS transistor has an isolation structure. The isolation structure may be, for example, a shallow trench isolation (STI) structure or a local oxidation of silicon (LOCOS) structure, under a gate electrode of the conventional HV device. The conventional HV device having the isolation structure under the gate electrode can have a desired breakdown voltage. Conventionally, the STI structure or the LOCOS structure has a thickness in the range of thousands of angstroms.

A second conventional HV device has an insulated gate field-effect device structure. The gate field-effect device structure has a drain and a source. The drain is formed with an extended well region having one or more buried layers of opposite conduction type sandwiched therein. The one or more buried layers create an associated plurality of parallel conduction channels in the extended portion of the well region.

Based on the foregoing, HV devices and methods for forming the HV devices are desired.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover all possible orientations of the device including the features.

FIG. 1 is a schematic cross-sectional view of an exemplary high voltage (HV) device. In FIG. 1, an HV device 100 can include a well region 105 of a first dopant type, for example, n-type dopant, disposed in a substrate 101. In embodiments, the HV device 100 can be referred to as an HV laterally diffused MOS (HV LDMOS) transistor, an HV extended drain MOS (HV EDMOS) transistor, or any other HV device.

In embodiments, the substrate 101 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or combinations thereof. In one embodiment, the alloy semiconductor substrate may be a SiGe alloy with a gradient SiGe feature in which the Si and Ge composition change from one ratio at one location to another ratio at another location of the gradient SiGe feature. In another embodiment, the SiGe alloy is formed over a silicon substrate. In some embodiments, a SiGe alloy can be mechanically strained by other materials in contact with the SiGe alloy. Furthermore, the semiconductor substrate may be a semiconductor on insulator, such as silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

The well region 105 can be referred to as a drift region. Well region 105 has a first edge 105a to the right of the HV device 100 and a second edge 105b to the left of the HV device 100. In some embodiments, the well region 105 can have a dopant type opposite to that of the substrate 101. In other embodiments, the well region 105 can have a dopant concentration that is higher than that of the substrate 101.

Referring to FIG. 1, the HV device 100 can include at least one isolation structure 107, at least partially disposed in the well region 105. The isolation structure 107 can include a structure of a local oxidation of silicon (LOCOS), a shallow trench isolation (STI) structure, and/or any other suitable isolation structure.

The HV device 100 can include at least one well region, for example, well regions 110a-110d, of a second dopant type, e.g., a p-type dopant. The well regions 110a-110d can be disposed in the well region 105. The well regions 110a-110d can be spaced from each other. In embodiments, the well regions 110a-110d can have dopant concentrations that are higher than that of the well region 105 and/or the opposite dopant type to that of the well region 105.

The HV device 100 can include at least one gate electrode, for example, gate electrodes 120a-120d. The gate electrode 120a can be disposed between and over the well region 110a and the isolation structure 107. Each of the gate electrodes 120b-120d can be disposed between and over any two neighboring well regions of the well regions 110a-110d. In embodiments, the gate electrodes 120a-120e can be coupled with each other.

In embodiments, the gate electrodes 120a-120e can include polysilicon, silicon-germanium, at least one metallic material including elements and compounds such as, Mo, Cu, W, Ti, Ta, TiN, TaN, NiSi, CoSi, and/or other suitable conductive materials known in the art. In other embodiments, the gate electrodes 120a-120e can include a work function metal layer such that it provides a metal gate with an N-type-metal work function or P-type-metal work function. P-type-metal work function materials include compositions such as ruthenium, palladium, platinum, cobalt, nickel, and conductive metal oxides, and/or other suitable materials. N-type metal work function materials include compositions such as hafnium, zirconium, titanium, tantalum, aluminum, metal carbides (e.g., hafnium carbide, zirconium carbide, titanium carbide, and aluminum carbide), aluminides, and/or other suitable materials.

In embodiments, a gate dielectric structure (not labeled) can be disposed below each of the gate electrodes 120a-120e. The gate dielectric structure can have a single layer or a multi-layer structure. In embodiments for multi-layer structures, the gate dielectric structure can include an interfacial layer and a high-k dielectric layer. The interfacial layer can include dielectric material such as, silicon oxide, silicon nitride, silicon oxinitride, other dielectric material, and/or the combinations thereof. The high-k dielectric layer can include high-k dielectric materials such as $HfO_2$, HfSiO, HfSiON, HfTaO, HfTiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof.

In embodiments, the HV device 100 can optionally include a buried well region 103 of the first dopant type, e.g., an n-type dopant. The buried well region 103 can be disposed between the substrate 101 and the well region 105. In embodiments using an N-type HV device, the buried well region 103 can have an n-type dopant that is opposite to that of the substrate 101.

In embodiments, the HV device 100 can optionally include a well region 109 of the second dopant type, e.g., a p-type dopant. The well region 109 can be disposed between the buried well region 103 and the well region 105. The well region 109 can be coupled with the well region 110a. The well region 109 can be shorter than the buried well region 103 in the cross-sectional view shown in FIG. 1. In embodiments using an N-type HV device, the well region 109 can have a p-type dopant that is opposite to that of the buried well region 103. It is noted that the dopant types and/or locations of the buried well region 103, the well region 105, the well region 109, and/or the well regions 110-110d described above are merely exemplary. One of skill in the art would be able to modify them to achieve a desired HV device.

Referring to FIG. 1, the HV device 100 can include a doped region 111 of the first dopant type, e.g., n-type dopant. The doped region 111 can be disposed in the well region 105. In some embodiments, doped region 111 is disposed between first edge 105a and isolation structure 107. In some embodiments, well region 105 does not have another drain region between the isolation structure and the second edge 105b. In some embodiments using an N-type HV device, the doped region 111 can have an n-type dopant as same as the well region 105. The doped region 111 can be referred to as a drain region of the HV device 100. For embodiments forming N-type HV devices, the doped region 111 can have dopants such as Arsenic (As), Phosphorus (P), other group V elements, or any combinations thereof. For embodiments forming P-type HV devices, the doped region 111 can have dopants such as boron (B), other group III elements, or any combinations thereof.

In embodiments operating the HV device 100, the doped region 111 can receive a first voltage, for example, between about 10 V to about 100 V. The well region 110a can receive a second voltage, e.g., a ground voltage or 0 V, that is smaller than the first voltage. The gate electrode 120a can receive a third voltage that can turn on a channel under the gate electrode 120a. By applying the voltages to the doped region 111, the well region 110a, and the gate electrode 120a, a first electronic current can flow from the well region 110a through the well region 105 to the doped region 111.

In embodiments, each of the well regions 110b-110d can receive the second voltage, e.g., a ground voltage or 0 V, that is smaller than the first voltage. Each of the gate electrodes 120b-120e can receive the third voltage that can turn on a channel under each of the gate electrodes 120b-120e, respectively. For example, by applying the voltages to the doped region 111, the well region 110b, and the gate electrode 120b, a second electronic current can flow from the well region 110b through the well region 105 and the buried well region 103 to the doped region 111. Similarly, additional electronic currents can flow from the well region 110c-110d through the well region 105 and the buried well region 103 to the doped region 111. With the electronic currents flowing from the well regions 110a-110d to the doped region 111, the total on-state current of the HV device 100 can be increased. By increasing the total current of the HV device 100, the drain-to-source on resistance $R_{dson}$ of the HV device 100 can be desirably reduced.

In some embodiments, doped regions 113a-113d and 115a-115d can be disposed in the well regions 110a-110d, respectively. The doped regions 115a-115d can have, for example, the same dopant type as the well regions 110a-110d. The doped regions 113a-113d can have the dopant type that is opposite to that of the well regions 110a-110d. The doped regions 113a-113d can be referred to as source regions of the HV device 100. In some embodiments, the doped regions 111, 113a-113d, and 115a-115d can include a silicide structure (not shown). The silicide structure may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof.

In some embodiments applying the voltages to the well regions 110a-110d, the gate electrodes 120a-120e, and the doped region 111, a contact plug 135a can be disposed in a dielectric structure 130. The contact plug 135a can be electrically coupled with the doped region 111. A contact plug 135b can be electrically coupled with the gate electrode 120a. Contact plugs 135c-135f can be electrically coupled with the doped regions 113a-113d and 115a-115d, respectively. In embodiments, butting contacts (not labeled) can be disposed between the contact plugs 135c-135f and the doped regions 113a-113d and 115a-115d, respectively. The dielectric structure 130 may include materials such as oxide, nitride, oxynitride, low-k dielectric material, ultra low-k dielectric material, or any combinations thereof. In embodiments, the contact plugs 135a-135f can include materials such as tungsten, aluminum, copper, titanium, tantalum, titanium nitride, tantalum nitride, nickel silicide, cobalt silicide, other proper conductive materials, and/or combinations thereof.

Referring to FIG. 1, metal layers 140a-140f can be disposed over the dielectric structure 130 and electrically coupled with the contact plugs 135a-135f, respectively. In embodiments, the metal layers 140a-140f can include materials such as tungsten, aluminum, copper, titanium, tantalum, titanium nitride, tantalum nitride, nickel silicide, cobalt silicide, other proper conductive materials, and/or combinations thereof. In embodiments operating the HV device 100 at a voltage of about 100 V or below, the metal layers 140a and 140b are substantially free from extending in the channel direction under the gate electrodes 120a and/or 120b. The metal layers 140a and 140b can be extended in a direction orthogonal to the channel direction.

Figure 2:
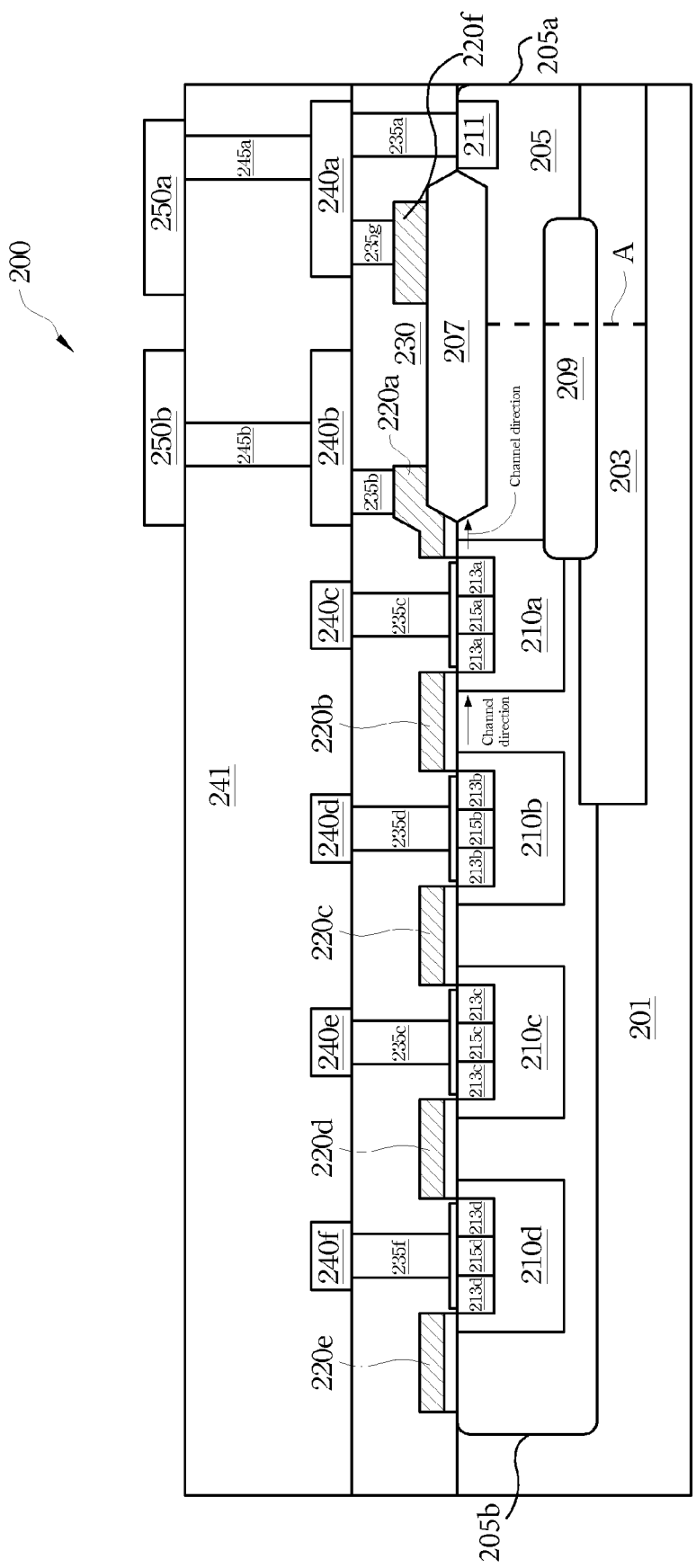
FIG. 2 is a schematic cross-sectional view of a second exemplary embodiment of a HV device.

FIG. 2 is a schematic cross-sectional view illustrating a second exemplary embodiment of an HV device. Features of the HV device 200 shown in FIG. 2 that correspond with the same features of the HV device 100 in FIG. 1 are indicated in FIG. 2 by corresponding reference numerals, incremented by 100.

Referring to FIG. 2, an electrode structure 220f can be disposed over the isolation structure 207. The electrode structure 220f can be electrically coupled with a metal layer 240a through a contact plug 235g. In some embodiments, the metal layers 240a and 240b can extend in the same direction as the channel direction under the gate electrodes 220a and/or 220b. Edges of the metal layers 240a and 240b can extend toward the center of the isolation structure 207.

In some embodiments, a dielectric structure 241 can be disposed over the metal layers 240a-240f. Via plugs 245a and 245b can be disposed in the dielectric structure 241, electrically coupling the metal layers 240a-240b with metal layers 250a-250b, respectively. In some embodiments, the metal layers 250a and 250b can extend along the channel direction under the gate electrodes 220a and/or 220b. Edges of the metal layers 250a and 250b can extend further toward the center of the isolation structure 207. By extending the metal layers 240a-240b and/or 250a-250b, the breakdown voltage of the HV device 200 can be about 100 V or more, e.g., up to about 1,200 V.

Figure 3:
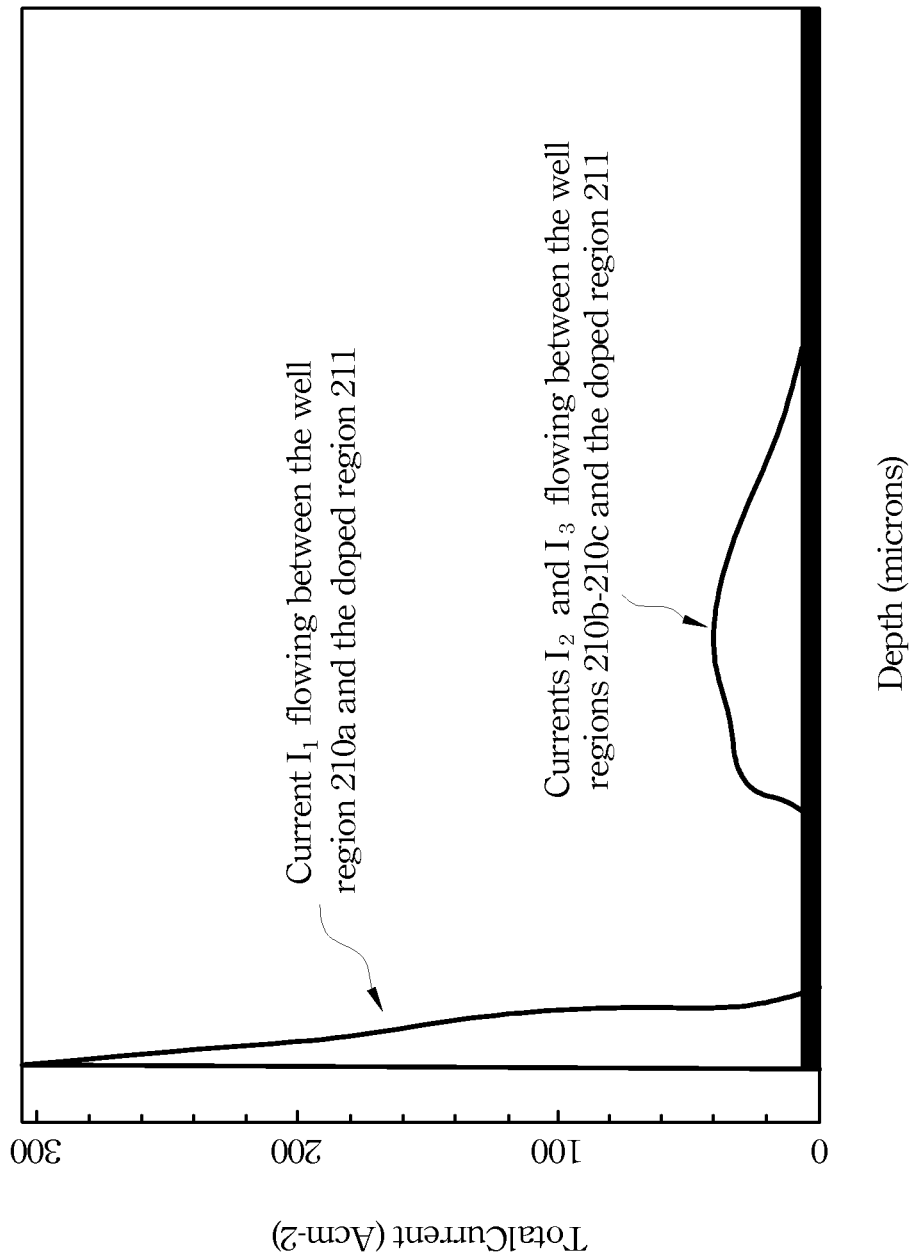
FIG. 3 is a schematic drawing illustrating an exemplary simulation result showing an increase of the drain-to-source current of an exemplary embodiment of an HV device.

FIG. 3 is a schematic drawing illustrating a simulation result showing an increase of the drain-to-source current of the HV device 200. In FIG. 3, the vertical axis represents a current flowing at a specific depth through the HV device 200 in units of A/cm². The horizontal axis represents the depth in the HV device 200 at which the current flows in units of μm. The simulation is taken at the cross-sectional line A shown in FIG. 2. In FIG. 3, the current $I_1$ can flow between the doped region 211 and the well region 210a. The current $I_1$ can be concentrated close to the bottom surface of the isolation structure 207. The currents $I_2$ and $I_3$ can flow between the well regions 210b-210c and the doped region 211, respectively. The currents $I_2$ and $I_3$ can be concentrated some distance from the bottom surface of the isolation structure 207. The currents $I_2$ and $I_3$ can increase the total current of the HV device 200 beyond that of $I_1$ alone. By increasing the total on-state current of the HV device 200, the drain-to-source on resistance $R_{dson}$ of the HV device 200 can be desirably reduced.

FIGS. 4A-4D are cross-sectional views illustrating an exemplary method of forming an exemplary HV device. Features of the HV device formed by the method described in conjunction with FIGS. 4A-4D that correspond with the same features of the HV device 100 in FIG. 1 are indicated in FIGS. 4A-4D by corresponding reference numerals, incremented by 300.

Figure 4A:
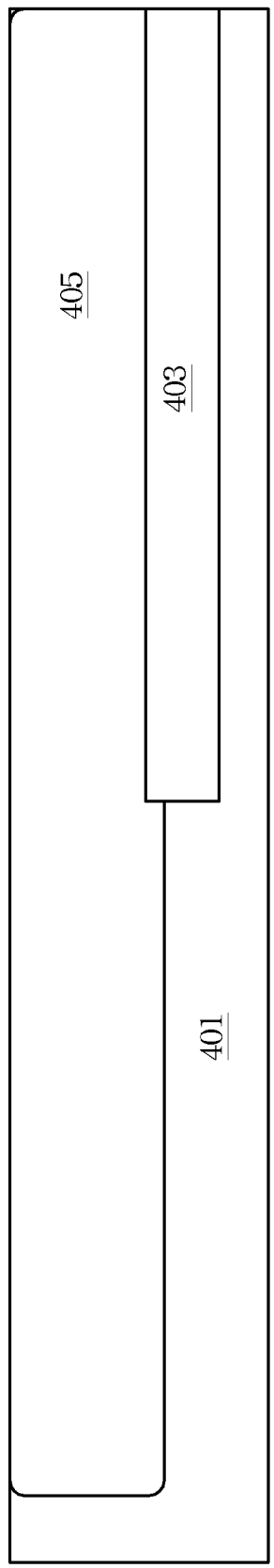
FIGS. 4A-4D are cross-sectional views of an exemplary embodiment of a method of forming an HV device.

In FIG. 4A, a buried well region 403 can be formed in a substrate 401. A well region 405 can be formed in the substrate 401 and over the buried well region 403. In some embodiments, the buried well region 403 and the well region 405 can be formed by any suitable process, such as ion implantation and/or a rapid thermal process (RTP) to activate the doped regions.

Figure 4B:
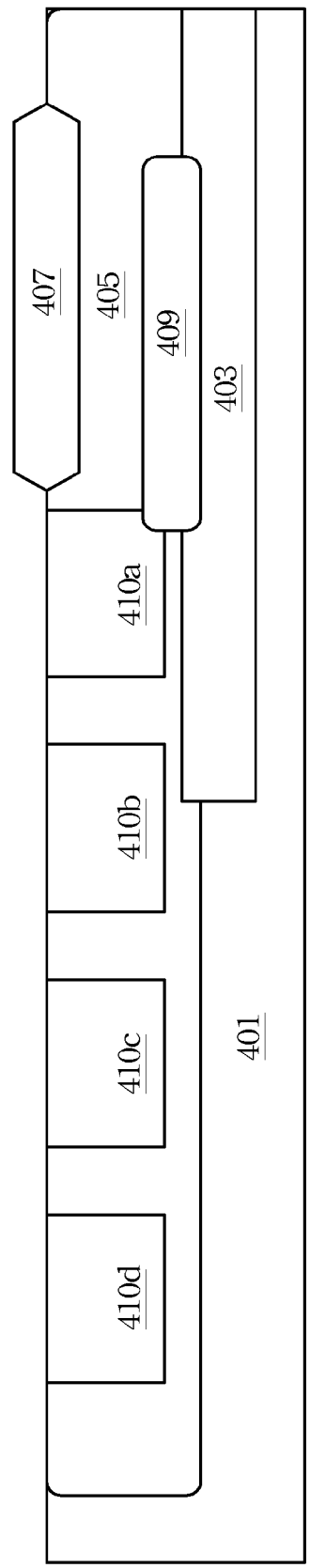

Referring to FIG. 4B, a well region 409 can be formed between the buried well region 403 and the well region 405. At least one well region, for example, well regions 410a-410d, can be formed in the well region 405. The well regions 410a-410d can be spaced from each other. The well region 410a can be electrically coupled with the well region 409. An isolation structure 407 can be formed over the well region 405.

In embodiments, the well region 409 and 410a-410d can be formed by any suitable process, such as ion implantation and/or a rapid thermal process (RTP) to activate the doped regions. The isolation structure 407 can be formed by, for example, an STI process, a LOCOS process, and/or other suitable method of forming isolation structures. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Figure 4C:
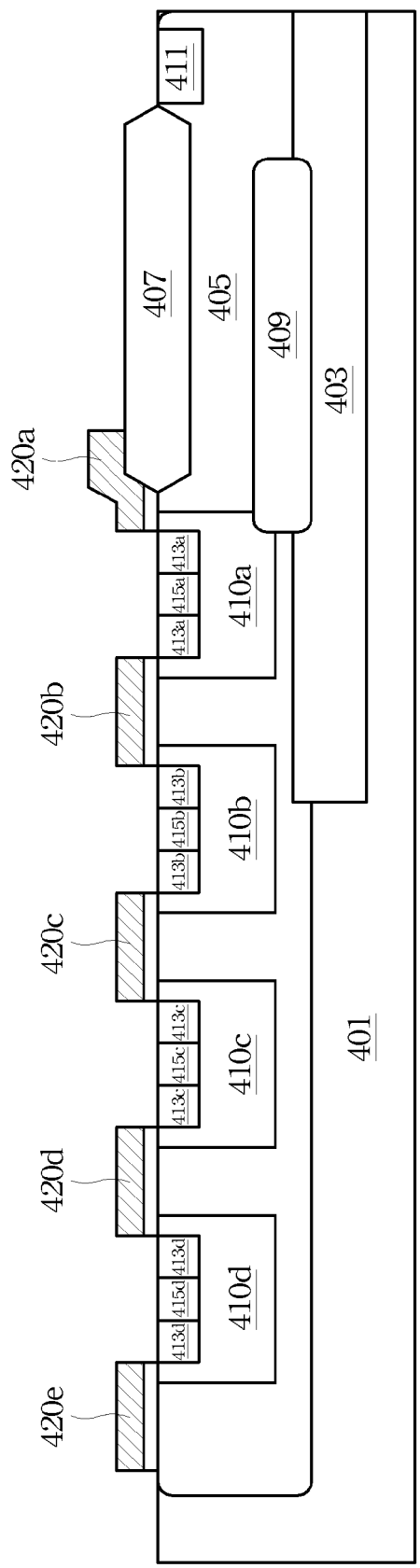

Referring to FIG. 4C, a doped region 411 can be formed within the well region 405. Doped regions 413a-413d and 415a-415d can be formed in the well regions 410a-410d, respectively. In some embodiments, the doped regions 411 and 413a-413d can be formed by a single implantation process. The doped regions 411, 413a-413d, and 415a-415d can be formed by any suitable process, such as ion implantation and/or a rapid thermal process (RTP) to activate the doped regions.

Gate electrode 420a can be formed between and over the well region 410a and the isolation structure 407. Each of the gate electrodes 420b-420d can be formed between and over any two neighboring well regions of the well regions 410a-410d. In embodiments, the gate electrodes 420a-420e can be electrically coupled with each other.

In embodiments, the gate electrode 420a-420e can be formed over gate dielectric structures (not labeled). The gate electrodes 420a-420e can be formed by any suitable process, such as atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof. In some embodiments, a silicide structure can be formed over the gate electrodes 420a-420e. The salicidation process may react a deposited metallic material and the gate electrode at an elevated temperature that is selected based on the specific material or materials. This is also referred to as annealing, which may include a RTP. The reacted silicide may require a one step RTP or multiple step RTPs.

Figure 4D:
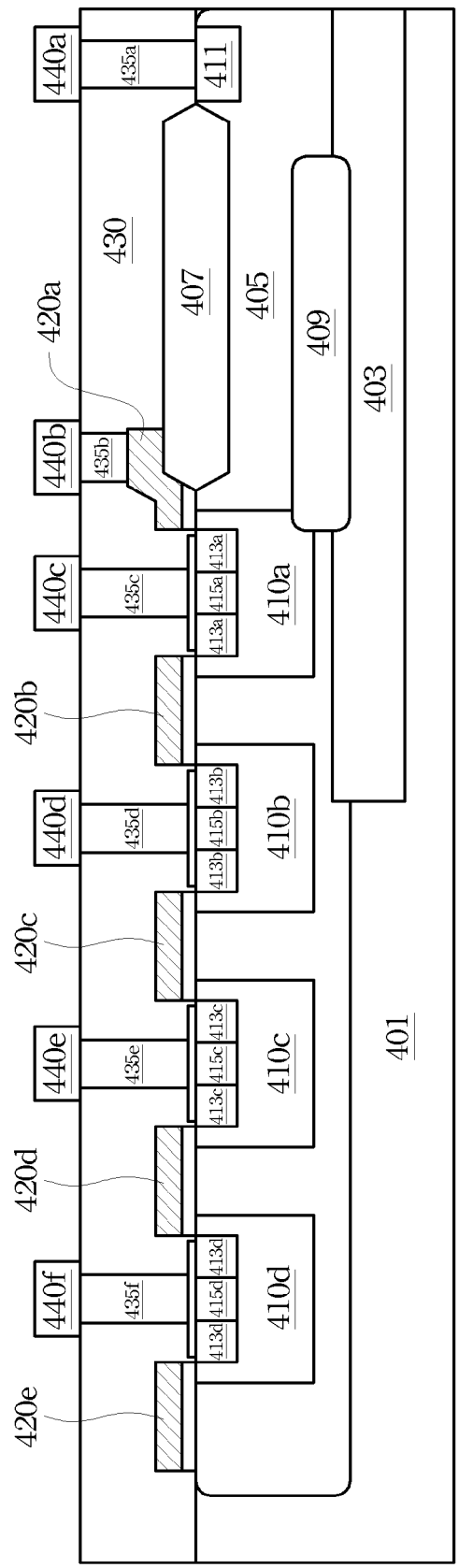

Referring to FIG. 4D, a dielectric structure 430 can be formed over the gate electrodes 420a-420e. Contact plugs 435a-435f can be formed in the dielectric structure 430 and electrically coupled with the doped region 411, the gate electrode 420a, and the doped regions 415a-415d, respectively. Metal layers 440a-440f can be formed over the dielectric structure 430 and electrically coupled with the contact plugs 435a-435f, respectively.

The dielectric layer 430 may be formed by depositing a dielectric material by CVD, ALD, PVD, other suitable processes, or combinations of the processes. The contact plugs 435a-435fc can be formed by, for example, patterning the dielectric layer 430 by a photolithography process, etching contact holes in the dielectric layer 430 (for example, by using a dry etching, wet etching, and/or plasma etching process), and filling the trench (for example, by using a chemical vapor deposition process) with at least one metallic material.

The metal layers 440a-440f can be formed by, for example, depositing a metallic material by CVD, ALD, PVD, and/or suitable processes over the dielectric layer 430. A photolithographic process and etch process can be performed to pattern the metallic material, defining the metallic layers 440a-440f.

In some embodiments, additional dielectric materials, via plugs, metallic regions, and/or metallic lines can be formed over the metallic layers 440a-440f for interconnection. The via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The via plugs, metallic regions, and/or metallic lines can be formed by any suitable processes, such as deposition, photolithography, and etching processes, and/or combinations thereof.

Figure 5:
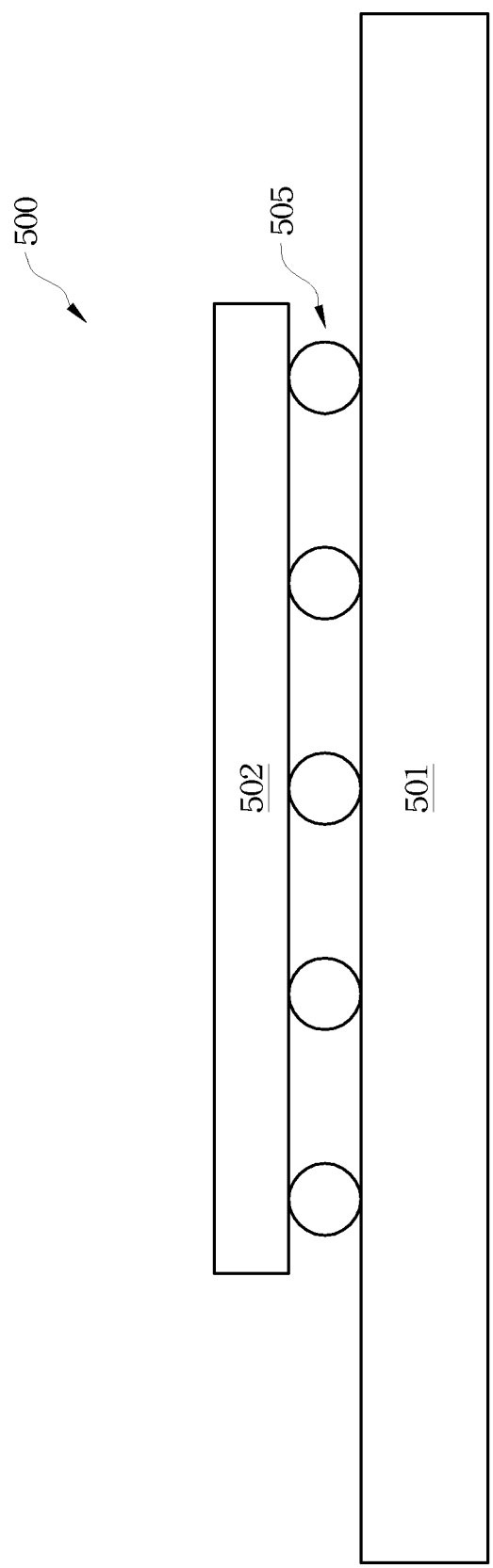
FIG. 5 is a schematic drawing of a system that includes an exemplary embodiment of an integrated circuit disposed over a substrate board.

FIG. 5 is a schematic drawing of a system that includes an exemplary embodiment of an integrated circuit disposed over a substrate board. In FIG. 5, a system 500 can include an integrated circuit 502 disposed over a substrate board 501. The substrate board 501 can include a printed circuit board (PCB), a printed wiring board and/or other carrier that is capable of carrying an integrated circuit. The integrated circuit 502 can include the HV devices 100 and/or 200 described above in conjunction with FIGS. 1 and 2, respectively. The integrated circuit 502 can be electrically coupled with the substrate board 501. In some embodiments, the integrated circuit 502 can be electrically coupled with the substrate board 501 through bumps 505. In other embodiments, the integrated circuit 502 can be electrically coupled with the substrate board 501 through wire bonding. The system 500 can be a part of an electronic system such as computers, wireless communication devices, computer-related peripherals, entertainment devices, or the like.

In some embodiments, the system 500 including the integrated circuit 502 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

In accordance with one embodiment, a method of forming a device includes forming a buried well region of a first dopant type in a substrate. A well region of the first dopant type is formed over the buried well region. A first well region of a second dopant type is formed between the well region of the first dopant type and the buried well region of the first dopant type. A second well region of the second dopant type is formed in the well region of the first dopant type. An isolation structure is formed at least partially in the well region of the first dopant type. A first gate electrode is formed over the isolation structure and the second well region of the second dopant type.

In accordance with another embodiment, a method of forming a device includes forming a well region of a first dopant type in a substrate. A first well region of a second dopant type is formed in the well region of the first dopant type. An isolation structure is formed at least partially in the well region of the first dopant type. A first gate electrode is formed over the isolation structure and the first well region of the second dopant type. A doped region of the first dopant type is formed in the well region of the first dopant type. An electrode structure is formed over the isolation structure, the electrode structure being electrically coupled with the doped region.

In accordance with another embodiment, a method of forming a transistor includes forming a well region of a first dopant type in a substrate. The well region of the first dopant type has a first edge and a second edge. A first well region of a second dopant type is formed in the well region of the first dopant type. An isolation structure is formed at least partially in the well region of the first dopant type. The isolation structure is between the first well region of the second dopant type and the first edge of the well region of the first dopant type. A first gate electrode is formed over the isolation structure and the first well region of the second dopant type. A doped region of the first dopant type is formed in the well region of the first dopant type. The doped region functions as a drain region of the transistor and is between the isolation structure and the first edge of the well region of the first dopant type. The well region of the first dopant type is free from having another drain region between the isolation structure and the second edge of the well region of the first dopant type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device, the method comprising:
    forming a buried well region of a first dopant type in a substrate;
    forming a well region of the first dopant type over the buried well region;

forming a first well region of a second dopant type between the well region of the first dopant type and the buried well region of the first dopant type;
forming a second well region of the second dopant type in the well region of the first dopant type;
forming an isolation structure at least partially in the well region of the first dopant type;
forming a first gate electrode over the isolation structure and the second well region of the second dopant type;
forming a third well region of the second dopant type in the well region of the first dopant type, the third well region of the second dopant type being spaced from the second well region of the second dopant type; and
forming a second gate electrode at least partially overlapping the second well region of the second dopant type and the third well region of the second dopant type.

2. The method of claim 1, further comprising:
forming at least one fourth well region of the second dopant type in the well region of the first dopant type, the at least one fourth well region of the second dopant type being spaced from the third well region of the second dopant type; and
forming at least one third gate electrode between and over the third well region of the second dopant type and the at least one fourth well region of the second dopant type.

3. The method of claim 1, further comprising:
forming a doped region of the first dopant type in the well region of the first dopant type.

4. The method of claim 3, further comprising:
forming at least one metallic layer over and electrically coupled with the doped region of the first dopant type, wherein the at least one metallic layer extends along the direction of the channel under the first gate electrode.

5. The method of claim 4, further comprising:
forming an electrode structure over the isolation structure, wherein the electrode structure is electrically coupled with the at least one metallic layer.

6. The method of claim 1, wherein the first well region of the second dopant type is electrically coupled with the second well region of the second dopant type.

7. The method of claim 1, further comprising:
forming at least one metallic layer over and electrically coupled with the first gate electrode, wherein the at least one metallic layer extends along a direction of a channel under the first gate electrode.

8. The method of claim 1, further comprising forming a silicide structure over the second well region of the second dopant type or the third well region of the second dopant type.

9. A method of forming a device, the method comprising:
forming a well region of a first dopant type in a substrate;
forming a first well region of a second dopant type in the well region of the first dopant type;
forming an isolation structure at least partially in the well region of the first dopant type;
forming a first gate electrode over the isolation structure and the first well region of the second dopant type;
forming a doped region of the first dopant type in the well region of the first dopant type;
forming an electrode structure over the isolation structure, the electrode structure being electrically coupled with the doped region;
forming a second well region of the second dopant type in the well region of the first dopant type, the second well region of the second dopant type being spaced from the first well region of the second dopant type; and
forming a second gate electrode between and over the first well region of the second dopant type and the second well region of the second dopant type.

10. The method of claim 9, further comprising:
forming a buried well region of the first dopant type below the well region of the first dopant type; and
forming a third well region of the second dopant type between the well region of the first dopant type and the buried well region of the first dopant type.

11. The method of claim 10, wherein the third well region of the second dopant type is electrically coupled with the first well region of the second dopant type.

12. The method of claim 9, further comprising:
forming at least one fourth well region of the second dopant type in the well region of the first dopant type, the at least one fourth well region of the second dopant type being spaced from the second well region of the second dopant type; and
forming at least one third gate electrode between and over the second well region of the second dopant type and the at least one fourth well region of the second dopant type.

13. The method of claim 9, further comprising:
forming at least one metallic layer over and electrically coupled with the first gate electrode, wherein the at least one metallic layer extends along a direction of a channel under the first gate electrode.

14. The method of claim 9, further comprising forming a silicide structure over the first well region of the second dopant type or the second well region of the second dopant type.

15. A method of forming a transistor, comprising:
forming a well region of a first dopant type in a substrate, the well region of the first dopant type having a first edge and a second edge;
forming a first well region of a second dopant type in the well region of the first dopant type;
forming an isolation structure at least partially in the well region of the first dopant type, the isolation structure being between the first well region of the second dopant type and the first edge of the well region of the first dopant type;
forming a first gate electrode over the isolation structure and the first well region of the second dopant type;
forming a doped region of the first dopant type in the well region of the first dopant type, the doped region functioning as a drain region of the transistor and being between the isolation structure and the first edge of the well region of the first dopant type, the well region of the first dopant type being free from having another drain region between the isolation structure and the second edge of the well region of the first dopant type;
forming a buried well region of the first dopant type below the well region of the first dopant type; and
forming a second well region of the second dopant type between the well region of the first dopant type and the buried well region of the first dopant type.

16. The method of claim 15, wherein the second well region of the second dopant type is electrically coupled with the first well region of the second dopant type.

17. The method of claim 15, further comprising:
forming a third well region of the second dopant type in the well region of the first dopant type, the third well region of the second dopant type being spaced from the first well region of the second dopant type; and
forming a second gate electrode between and over the first well region of the second dopant type and the third well region of the second dopant type.

18. The method of claim 17, further comprising:
- forming at least one fourth well region of the second dopant type in the well region of the first dopant type, the at least one fourth well region of the second dopant type being spaced from the third well region of the second dopant type; and
- forming at least one third gate electrode between and over the third well region of the second dopant type and the at least one fourth well region of the second dopant type.

19. The method of claim 15, further comprising:
- forming at least one metallic layer over and electrically coupled with the first gate electrode, wherein the at least one metallic layer extends along a direction of a channel under the first gate electrode.

20. The method of claim 15, further comprising forming a silicide structure over the first well region of the second dopant type.

* * * * *